United States Patent
Yamamoto (10) Patent No.: US 7,034,518 B2
(45) Date of Patent: Apr. 25, 2006

(54) TIMING GENERATOR AND SEMICONDUCTOR TEST APPARATUS

(75) Inventor: Kazuhiro Yamamoto, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 10/484,980

(22) PCT Filed: Jul. 26, 2002

(86) PCT No.: PCT/JP02/07606

§ 371 (c)(1),
(2), (4) Date: Aug. 26, 2004

(87) PCT Pub. No.: WO03/010549

PCT Pub. Date: Feb. 6, 2003

(65) Prior Publication Data

US 2005/0001648 A1    Jan. 6, 2005

(30) Foreign Application Priority Data

Jul. 27, 2001    (JP)    ............................. 2001-227745

(51) Int. Cl.
*G01R 31/26* (2006.01)
(52) U.S. Cl. .................................... 324/158.1; 324/765
(58) Field of Classification Search ................ 324/765, 324/158.1, 772, 763; 714/724, 733
See application file for complete search history.

(56) References Cited

U.S. PATENT DOCUMENTS

| | | | | |
|---|---|---|---|---|
| 6,005,408 A | * | 12/1999 | Gillette | ........................ 324/765 |
| 6,377,065 B1 | * | 4/2002 | Le et al. | ..................... 324/765 |
| 6,479,983 B1 | * | 11/2002 | Ebiya | ...................... 324/158.1 |

FOREIGN PATENT DOCUMENTS

| | | |
|---|---|---|
| JP | 61-093711 | 5/1986 |
| JP | 05-045418 | 2/1993 |
| JP | 05-240919 | 9/1993 |
| JP | 06-196958 | 7/1994 |
| JP | 2000-131401 | 5/2000 |
| JP | 2000-332583 | 11/2000 |

* cited by examiner

*Primary Examiner*—Vinh Nguyen
*Assistant Examiner*—Tung X. Nguyen
(74) *Attorney, Agent, or Firm*—Muramatsu & Associates (57) ABSTRACT

There is provided a timing generator capable of absorbing a delay time error of a variable delay circuit without increasing the number of bits of path data and suppressing deterioration of the timing accuracy from the designed value to the minimum. The timing generator is configured to include a selection unit which assigns five-bit delay device candidates to a three-bit partial bit signal of all the bit signals constituting the path data outputted from a linearization memory and selects three delay devices whose number is equal to the bit count of the partial bit signal.

7 Claims, 6 Drawing Sheets

TIMING GENERATOR AND SEMICONDUCTOR TEST APPARATUS

The present application is a 371 of PCT/JP02/07606 filed Jul. 26, 2002 which claim the benefit of priority to Japanese Application No. 2001-227745 filed Jul. 27, 2001

TECHNICAL FIELD

The present invention relates to a timing generator, and more particularly to a timing generator which has a redundancy circuit provided in a variable delay circuit and can realize the timing accuracy close to a design value, and to a semiconductor test apparatus including this timing generator.

BACKGROUND ART

Before explaining the present invention, a conventional semiconductor test apparatus will be first described with reference to FIG. 5 in order to facilitate understanding of the present invention.

Figure 5:
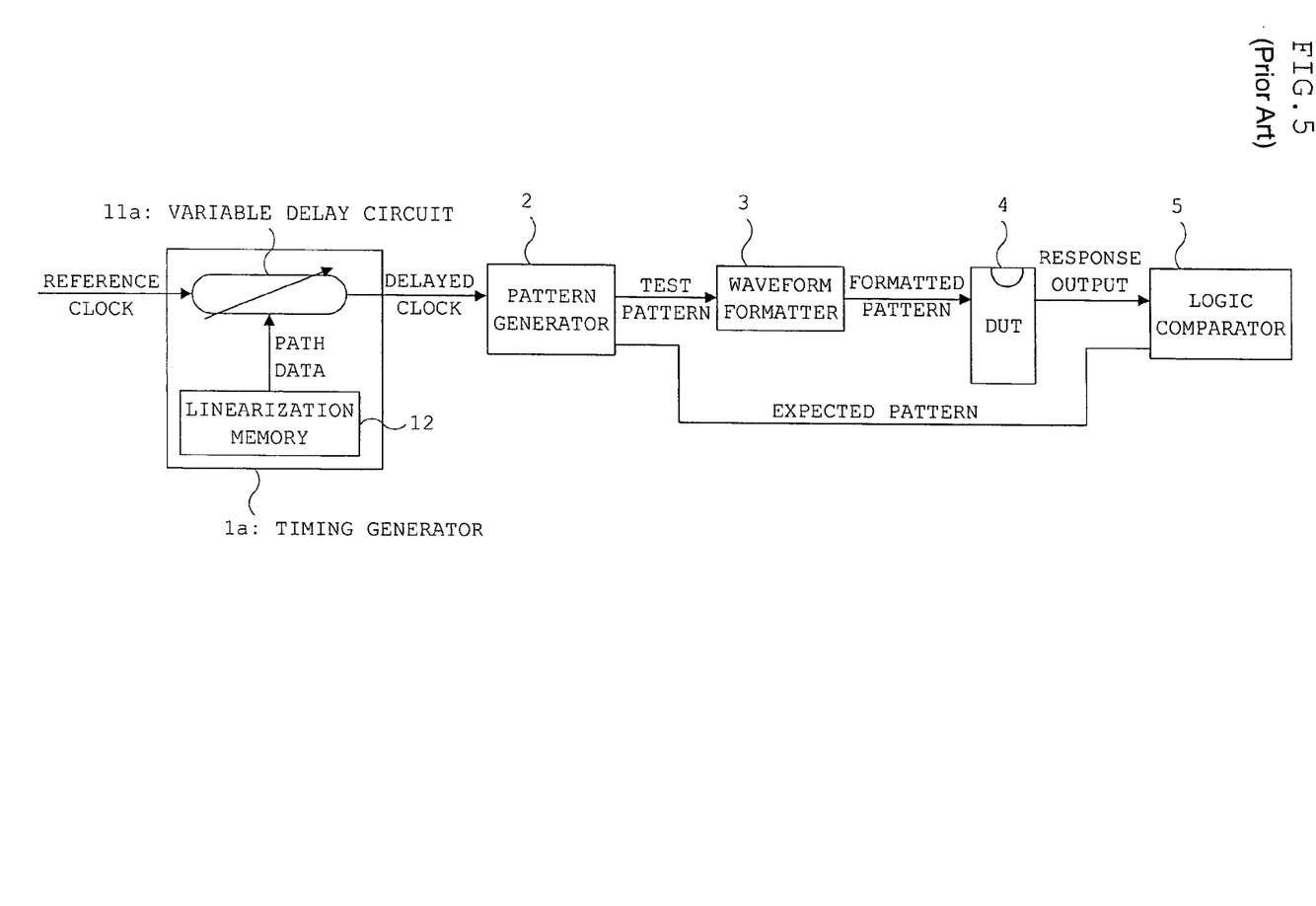
FIG. 5 is a block diagram illustrating a structure of a semiconductor test apparatus according to a prior art.

As shown in FIG. 5, a semiconductor test apparatus is generally constituted of a timing generator 1a, a pattern generator 2, a waveform formatter 3 and a logic comparator 5.

The timing generator 1a outputs a delayed clock signal obtained by delaying a reference clock signal as much as a predetermined time by use of a variable delay circuit 11a. The variable delay circuit 11a is constituted of a plurality of delay devices which respectively generate delay times different from each other. Further, a delay time which is approximately twofold of a delay time of a delay device on a precedent stage is sequentially set to each delay device in order to realize an efficient combination.

The pattern generator 2 outputs a test pattern signal and an expected pattern signal in synchronization with the delayed clock signal.

The waveform formatter 3 formats the test pattern signal to a necessary waveform and inputs a result to a semiconductor device (which will be also abbreviated as a "DUT" (Device Under Test) hereinafter) 4 as a test target.

Furthermore, the logic comparator 5 compares a response output from the DUT 4 with an expected data signal. Therefore, it detects a failure of the DUT based on the match/mismatch.

Here, an operation timing of the semiconductor test apparatus is determined based on the delayed clock signal outputted from the timing generator 1a. The timing generator la delays a reference clock as much as a desired delay time and generates a delayed clock by using a combination of the plurality of delay devices constituting the variable delay circuit 11a.

The respective delay devices constituting the variable delay circuit generally have different structures depending on bands of delay times. For example, as a delay device which generates a delay time longer than a clock cycle, a flip-flop is used. Combining the flip-flops can readily obtain a delay time which is an integral multiple of the clock cycle. For example, when the clock cycle is four nano-seconds (ns), a delay time which is an integral multiple of this clock cycle can be easily obtained.

As a delay device which generates a delay time longer than a delay quantity corresponding to two stages of inverters, inverters connected in series are usually used. Further, as a delay device which generates a delay time shorter than a delay quantity corresponding to two stages of inverters, load capacitances of inverters are usually used.

An example of a conventional variable delay circuit will now be described with reference to FIG. 6.

Figure 6:
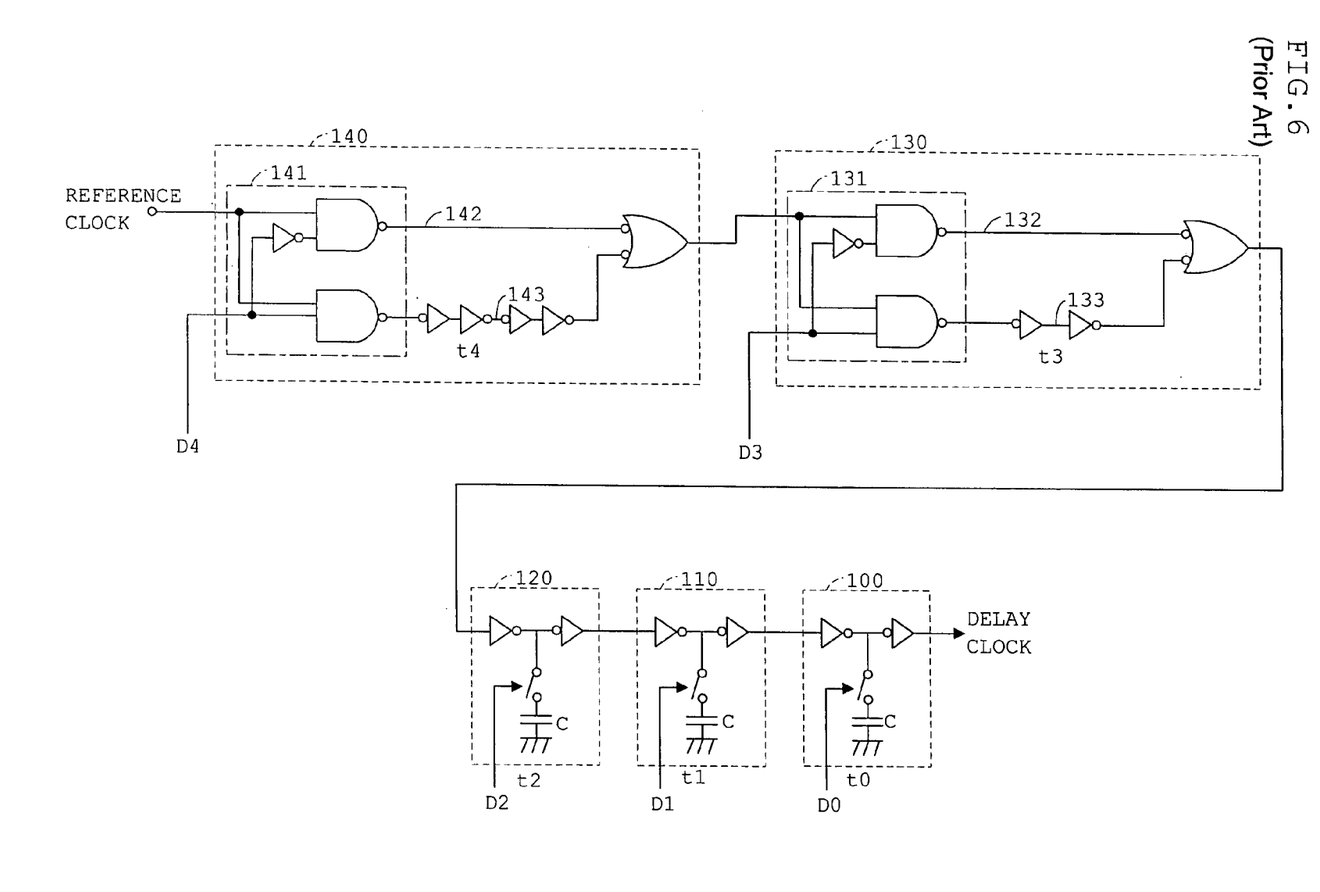
FIG. 6 is a block diagram illustrating a structure of a variable delay circuit according to a prior art.

In the variable delay circuit shown in FIG. 6, two delay devices 130 and 140 obtained by connecting multi-stages of inverters with each other are connected with three delay devices 100, 110 and 120 using load capacitances in series.

The delay device 140 is constituted of a delay path 143 obtained by connecting four stages of inverters in series, a bypass 142 of this delay path, and a path selection unit 141 which selects the delay path 143 or the bypass 142 based on a value of a bit D4 in path data. When the delay path 143 is selected, the delay device 140 generates a delay time t4.

The delay device 130 is constituted of a delay path 133 obtained by connecting two stages of inverters in series, a bypass 132 of this delay path, and a path selection unit 131 which selects the delay path 133 or the bypass 132 based on a value of a bit D3 in path data. When the delay path 133 is selected, the delay device 130 generates a delay time t3.

Furthermore, in the delay devices 100, 110 and 120, a load capacitance C is connected to each inverter through a switching device. Moreover, the switching device is opened/closed based on values of bits D0, D1 and D2 in path data. In the respective delay devices, when the switching device is closed (when a conduction state is obtained), delay times t0, t1 and t2 are respectively generated.

The path data (D0 to D4) which specifies a combination of the delay devices is associated with the delay time, and it is stored in a linearization memory 12 (see FIG. 5) in the order of delay times. As a result, specifying the path data can generate a delayed clock with a desired delay time.

Meanwhile, in the variable delay circuit constituting the timing generator, the quality of the delay devices varies, and a delay time of each delay device has an error relative to a designed value. Thus, there may occur a large error between a delay time which is actually given based on a combination of the delay devices and an originally designed delay time.

As a result, intervals of the delay times obtained by combining the delay devices vary, thereby deteriorating a time resolution of the variable delay circuit. Therefore, since the variable delay circuit must be recreated in order to realize the timing accuracy according to a design, it can be a factor of a delay in an development work period.

A description will now be given as to a case that designed delay times of the delay devices 100, 110 and 120 shown in FIG. 6 are t0=2 ps, t1=4 ps and t2=8 ps, respectively. In this case, it is possible to generate delay times t0=2 ps, t1=4 ps, t0+t1=6 ps, t2=8 ps, t2+t0=10 ps, t2+t1=12 ps, and t2+t1+t0=14 ps by combining the three delay devices. In this case, since intervals between the respective delay times are all 2 ps, the time resolution is 2 ps.

However, when the delay time to of the delay device 100 greatly deviates from the designed value 2 ps for example, irregularities are produced in intervals of the generated delay times, thereby lowering the time resolution. For example, when t0=1 ps, the delay times are t0=1 ps, t1=4 ps, t0+t1=5 ps, t2=8 ps, t2+t0=9 ps, t2+t1=12 ps, and t2+t1+t0=13 ps. In this case, there may occur a case that a maximum interval between the delay times is 3 ps. Therefore, the time resolution is lowered to 3 ps.

In order to narrow the intervals between the delay times, it can be considered to increase the number of the delay devices constituting the variable delay circuit and narrowing each delay time difference itself between the delay devices.

However, when the number of the delay devices is increased, the number of bits in the path data used to select the delay device must be also increased. As a result, a memory capacity of the linearization memory is increased.

Therefore, in view of the above-described problems, it is an object of the present invention to provide a timing generator which can absorb an error in delay time of a variable delay circuit and suppress deterioration in timing accuracy from a designed value to a minimum level, and a semiconductor test apparatus including this timing generator.

DISCLOSURE OF THE INVENTION

According to the present invention, there is provided a timing generator comprising: a variable delay circuit in which delay devices on a plurality of stages for generating delay times different from each other are connected in series; and a linearization memory which stores delay paths and delay times obtained based on a combination of the delay devices in the order of the delay times and outputs path data which specifies a delay path, the timing generator outputting a delayed clock signal obtained by delaying a reference clock signal as much as a predetermined time, wherein delay device candidates more than the bit number of a partial bit signal which is a part of all bit signals constituting the path data are assigned to the partial bit signal, and the timing generator includes a selection unit which selects the same number of the delay devices as the bit number of the partial bit signal from the delay device candidates.

As described above, according to the timing generator of this invention, delay device candidates more than the bit number of the partial bit signal are assigned in advance, and the delay devices which are actually used are selected from the delay device candidates.

As a result, even if a delay time of a delay device in the delay device candidates largely deviates from a designed value, the same number of other delay device candidates as the bit number can be combined and selected. Consequently, an error can be absorbed by combining the delay devices corresponding to the partial bit signal, and irregularities in intervals of the delay times can be suppressed to the minimum level. Therefore, according to the present invention, an error in delay time of the variable delay circuit can be absorbed without increasing the bit number of the path data, thereby realizing the timing accuracy according to a design.

Further, the delay device candidates according to the present invention are constituted of a plurality of delay devices in the order of shorter delay times from the delay device having a minimum delay time among the delay devices constituting the variable delay circuit. As a result, it is possible to suppress an influence of an error of the delay devices with short delay times which greatly affect irregularities in intervals of the delay times.

Here, the present invention can have a structure that the delay device candidates consist of passive devices only. As a result, the timing generation circuit according to the present invention can be constituted of arbitrary passive devices such as capacitors or resistors, and the present invention can be carried out based on a simple structure only. Furthermore, packaging such a timing generator can realize a semiconductor test apparatus which has a simple structure and is superior in multiusability, expansibility and others.

Moreover, the delay device candidates according to the present invention are constituted of the delay devices whose number is greater than the bit number of the partial bit signal by at least one. In the selection unit, the delay device candidates having delay times adjacent to each other are respectively assigned to the respective bit terminals of the partial bit signal, the delay device candidates having delay times adjacent to each other are redundantly assigned to the adjacent bit terminals, and one delay device is selected from the assigned delay device candidates with respect to each of the bit terminals in such a manner that the delay devices do not overlap among the bit terminals. As a result, the delay devices whose number corresponds to the bit number can be readily selected from the delay device candidates. Additionally, since a plurality of (two) adjacent delay device candidates are redundantly assigned, all the delay devices to be selected can be sequentially shifted.

Further, the selection unit according to the present invention is configured to select the delay devices based on a signal inputted from an external terminal. As a result, the delay devices whose number corresponds to the bit number can be readily selected from the delay device candidates.

Furthermore, the selection unit according to the present invention may be configured to select the delay devices by using a laser repair. The delay devices whose number corresponds to the bit number can be likewise readily selected from the delay device candidates.

Moreover, according to the present invention, there is provided a semiconductor test apparatus comprising: a timing generator which outputs a delayed clock signal obtained by delaying a reference clock signal as much as a predetermined time, a pattern generator which outputs a test pattern signal in synchronization with the reference clock signal; a waveform formatter which formats the test pattern signal in accordance with a device under test and inputs a result to a semiconductor device as a test target; and a logic comparator which compares a response output signal of the semiconductor device with an expected data signal, wherein the timing generator comprises a variable delay circuit in which delay devices on a plurality of stages for generating delay times different from each other are connected in series, and a linearization memory which stores delay paths and delay times based on a combination of the delay devices in the order of delay times and outputs path data which specifies the delay path, many delay devices having delay times in the same band as that of a delay time assigned to a partial bit signal which is a part of all bit signals constituting the path data more than the bit number of the partial bit signal are precautionarily assigned to the partial bit signal, and the timing generator includes a selection unit which selects the same number of delay devices as the bit number of the partial bit signal from the precautionarily assigned delay devices.

As described above, according to the semiconductor test apparatus of this invention, in the timing generator, delay device candidates more than the bit number of the partial bit signal are assigned in advance, and the delay devices which are actually used are selected from the delay device candidates.

As a result, even if a delay time of a delay device in the delay device candidates largely deviates from a designed value, any other delay device candidates whose number corresponds to the bit number can be combined and selected. Consequently, a combination of the delay devices corresponding to the partial bit signal can absorb an error, thereby suppressing irregularities in intervals of the delay times to a minimum level. As a result, an error in delay time of the variable circuit can be absorbed without increasing the bit number of the path data, thus realizing the timing accuracy according to a design.

BEST MODE FOR CARRYING OUT OF THE INVENTION

In order to explain the present invention in more detail, preferred embodiments of a timing generator and a semiconductor test apparatus according to the present invention will now be described with reference to the accompanying drawings.

Figure 1:
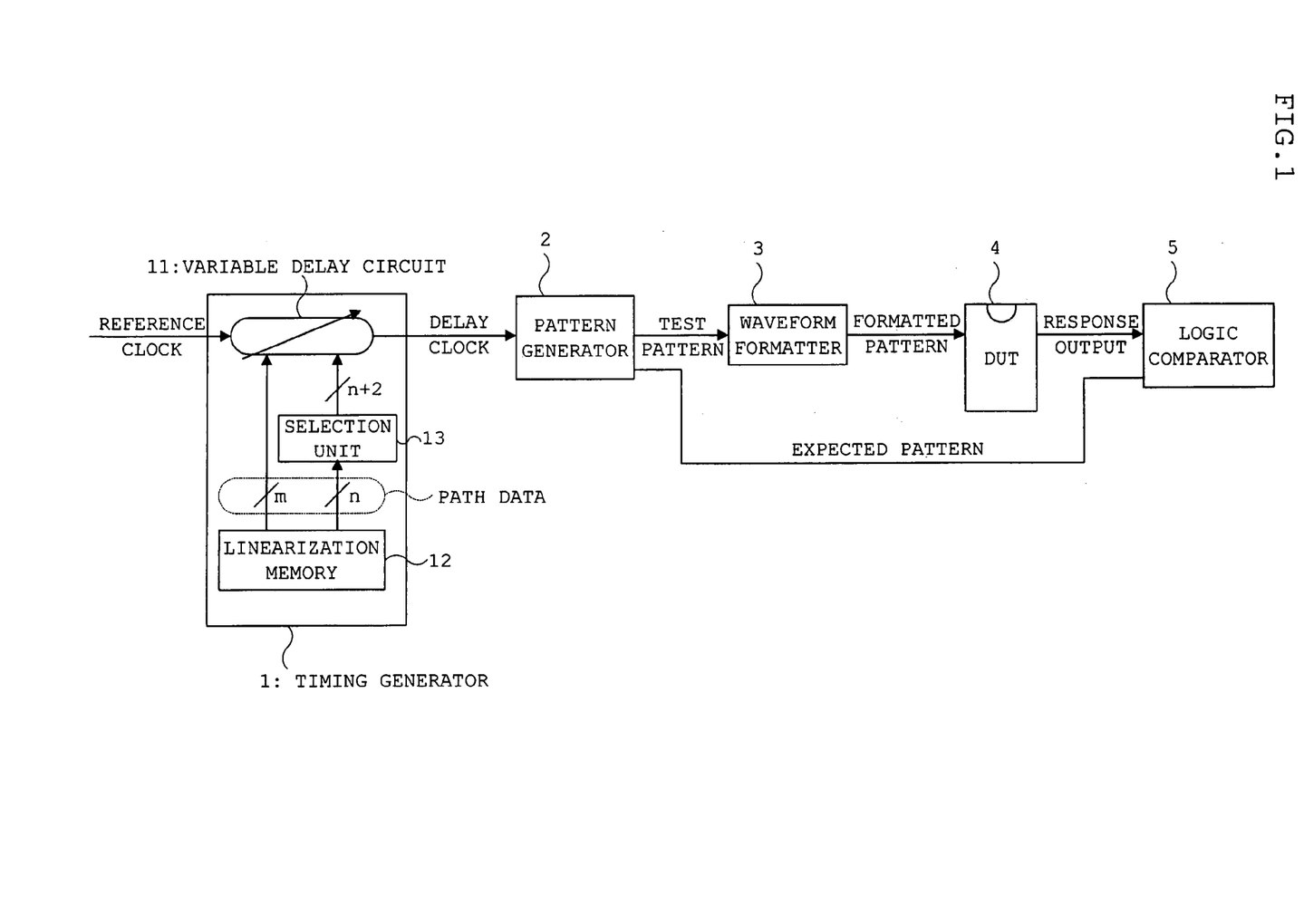
FIG. 1 is a block diagram illustrating a structure of a preferred embodiment of a semiconductor test apparatus according to the present invention.

Referring to FIG. 1, a structure of an embodiment of a semiconductor test apparatus according to the present invention will be first explained.

As shown in FIG. 1, the semiconductor test apparatus according to this embodiment is constituted of a timing generator 1, a pattern generator 2, a waveform formatter 3 and a logic comparator 5.

The timing generator 1 outputs a delayed clock signal obtained by delaying a reference clock signal as much as a desired time by use of a variable delay circuit 11.

The pattern generator 2 outputs a test pattern signal and an expected pattern signal in synchronization with the delayed clock signal.

The waveform formatter 3 formats the test pattern signal into a waveform required for a test and inputs a result to a semiconductor device (DUT) 4 as a test target.

Further, the logic comparator 5 compares a response output from the DUT 4 with the expected data signal. Then, it detects a failure of the DUT 4 based on the match/mismatch.

Furthermore, the timing generator 1 according to this embodiment includes the variable delay circuit 11 and a linearization memory 12 as well as a selection unit 13.

The variable delay circuit 11 has delay devices on a plurality of stages for generating delay times different from each other, the delay devices being connected in series.

Moreover, in the linearization memory 12, path data (D0 to D4) which specifies a combination of the delay devices is associated with each delay time, and they are stored in this memory in the order of delay times. Additionally, the linearization memory 12 outputs the path data which specifies a delay path.

In this embodiment, the delay data is constituted of a bit signal (binary signal) consisting of (m+n) bits. Further, of all bit signals constituting the delay data, a bit signal consisting of lower m bits (first group of bits) is directly inputted to the variable delay circuit 11, and a partial bit signal consisting of higher n bits (second group of bits) is inputted to the selection unit 13.

In the selection unit 13, (n+2) delay device candidates greater than the bit number (n) are assigned to this partial bit signal, i.e., the second group of bits. Furthermore, the selection unit 13 selects (n) delay devices whose number is equal to the bit number of the partial bit signal from the (n+2) delay device candidates.

A description will now be given as to a structure of the variable delay circuit 11 according to this embodiment with reference to FIG. 2.

In the variable delay circuit 11, two delay devices 130 and 140 (first group of delay devices) obtained by connecting multiple stages of inverters are connected with five delay devices 105, 100a, 110a, 120a and 125 (second group of delay devices) using load capacitances in series.

The delay device 140 is constituted of a delay path 143 obtained by connecting four stages of inverters in series, a bypass 142 of this delay path, and a path selection unit 141 which selects the delay path 143 or the bypass 142 based on a value of a bit D4 in the path data. When the delay path 143 is selected, the delay device 140 generates a delay time t4.

The delay device 130 is constituted of a delay path 133 obtained by connecting two stages of inverters in series, a bypass 132 of this delay path, and a path selection unit 131 which selects the delay path 133 or the bypass 132 based on a value of a bit D3 in the path data. When the delay path 133 is selected, the delay device 130 generates a delay time t3.

Moreover, the delay devices 105, 100a, 110a, 120a and 125 (second group of delay devices) have each inverter to which a load capacitance C is connected through a switching device. As each load capacitance C, it is preferable to utilize, e.g., a gate capacitance of a transistor. Additionally, when the switching device is closed, the load capacitance C is applied to the inverter, and the delay devices respectively generate delay times of tL, t0a, t1a, t2a and tH. It is to be noted that generated times have a relationship of tL <t0a<t1a<t2a<tH <t3<t4.

Further, when the delay times of the delay devices 100, 110 and 120 in the prior art shown in FIG. 6 are t0=2 ps, t1=4 ps and t2=8 ps, setting the delay times of the delay devices 105, 100a, 110a, 120a and 125 according to this embodiment in FIG. 3 as, e.g., tL=1.4 ps, t0a=2.5 ps, t1a=4.5 ps, t2a=8 ps and tH=14 Ps can suffice.

Here, since five delay device candidates having the delay times in the same band as the band of the delay time assigned to a partial bit signal corresponding to a three-bit part of D0 to D2 (second group of bits) are provided, intervals between the delay times of the respective delay device candidates are shorter than those in the prior art.

Opening/closing of each switching device is controlled based on bit values E0 to E4 of each control signal. In each delay device, the switching device can be established by using, e.g., a transfer gate. In this case, the transfer gate operates in such a manner that the gate is closed (entering a conductive state) when a bit value of the control signal is, e.g., "1", and that the gate is opened (entering a nonconductive state) when the same is "0".

Figure 3A:
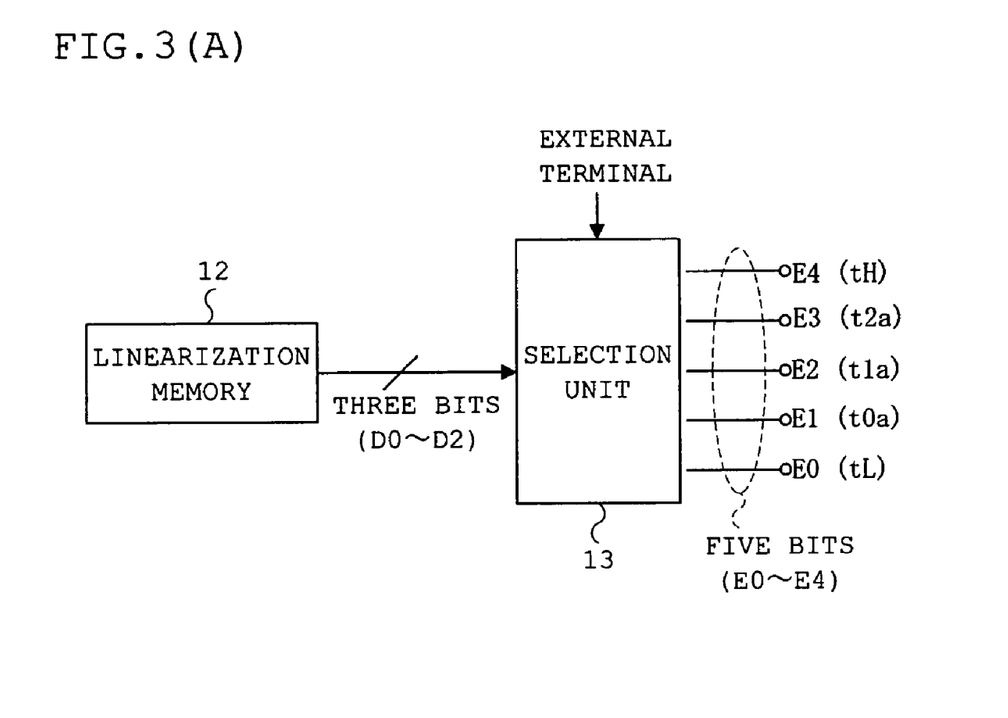
FIGS. 3(A) and (B) are schematic diagrams illustrating a preferred embodiment of a selection unit according to the present invention.

Furthermore, in this embodiment, of all bit signals of the path data, m=two bits (D4 and D3) which is the first group of bits noted above, and the partial bit signal corresponds to n=three bits (D2, D1 and D0) which is the second group of bits noted above. Moreover, as shown in FIG. 3 (A), five bits (E0 to E4) of the control signal are assigned to three bits D0, D1 and D2 of the partial bit signal.

That is, of the delay devices constituting the variable delay circuit, the five delay devices 105, 100a, 110a, 120a and 125 are assigned as delay device candidates in the order of shorter delay times from the delay device having the short delay time which greatly affects irregularities in intervals of the delay times.

Additionally, the selection unit 13 selects three bits from the control signal consisting of the five bits E0 to E4, and connects them to D0 to D2 of the partial bit signal.

When selecting the delay devices, it is preferable that the selection unit 13 selects them based on an input signal from an external terminal as shown in FIG. 3(A), for example.

Figure 3B:
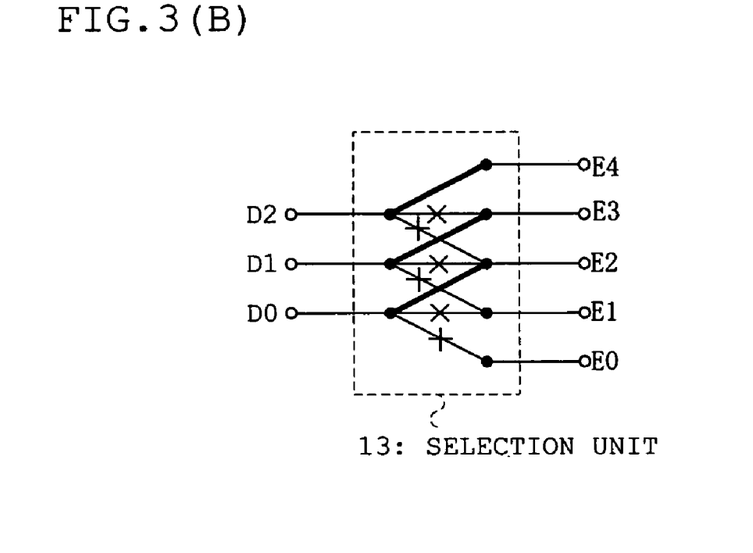

Further, the selection unit 13 may select the delay devices based on a laser repair. In this case, it is preferable to assign three delay device candidates having delay times adjacent to each other to respective bit terminals of the partial bit signal in such a manner that the two delay device candidates having delay times adjacent to each other overlap. For example, as shown in FIG. 3 (B), allocating E0, E1 and E2 to D0 terminal, allocating E1, E2 and E3 to a D1 terminal and allocating E2, E3 and E4 to a D2 terminal can suffice.

Furthermore, one delay device is selected with respect to each of the bit terminals D0 to D2 from the assigned three delay devices in such a manner they do not overlap among the bit terminals. For example, in FIG. 3(B), the E2 terminal is selected with respect to the D0 terminal, the E3 terminal is selected with respect to the D1 terminal, and the E4 terminal is selected with respect to the D2 terminal.

It is to be noted that each position disconnected by the laser repair is marked with "x".

As described above, since the delay device candidates larger than the number of bits of the second group of bits are provided in advance, and then the delay devices corresponding to the bit number are selected, a manufacture error in delay time can be absorbed without increasing the bit number of the path data. As a result, even if the delay time greatly deviates from a designed value, the timing accuracy according to a design can be realized without recreating the variable delay circuit.

In the above-described embodiment, although the description has been given as to the case that the present invention is configured under the specific conditions, the present invention can be modified in many ways.

For example, in the foregoing embodiment, the example that the delay device candidates whose number is greater than the bit number of the partial bit signal by two are assigned has been described, but the number of the delay device candidates is not restricted thereto. For example, the delay device candidates whose number is greater than the bit number of the partial bit signal by three or more may be assigned. That is, in the present invention, if the delay device candidates whose number is larger than the bit number of the partial bit signal by at least one are assigned, an error in delay time can be absorbed by using a combination of these delay device candidates.

It is to be noted that the delay device candidates are assigned to the bit signal only at parts corresponding to short delay times in the path data in the above-described embodiment, the delay device candidates may be assigned to all the bit signals in the path data in the present invention.

Moreover, although each of the plurality of delay device candidates is constituted of a pair of inverters, the capacitor and the switch in the foregoing embodiment (see FIG. 2), the delay device candidate according to the present invention is not restricted to this structure, and the delay device can be also configured by combining arbitrary devices and circuits.

Figure 2:
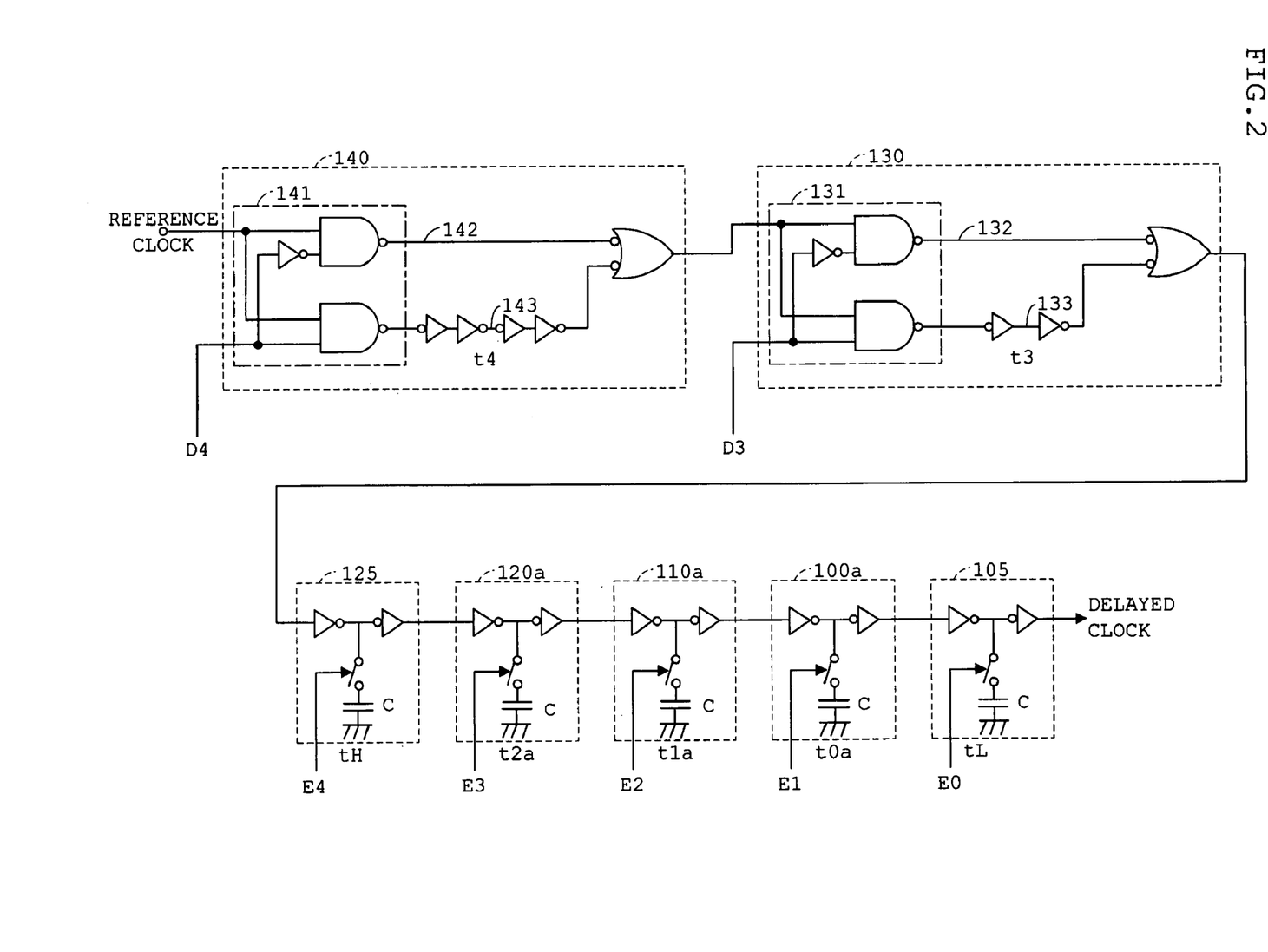
FIG. 2 is a block diagram illustrating a structure of a preferred embodiment of a variable delay circuit according to the present invention.
Figure 4:
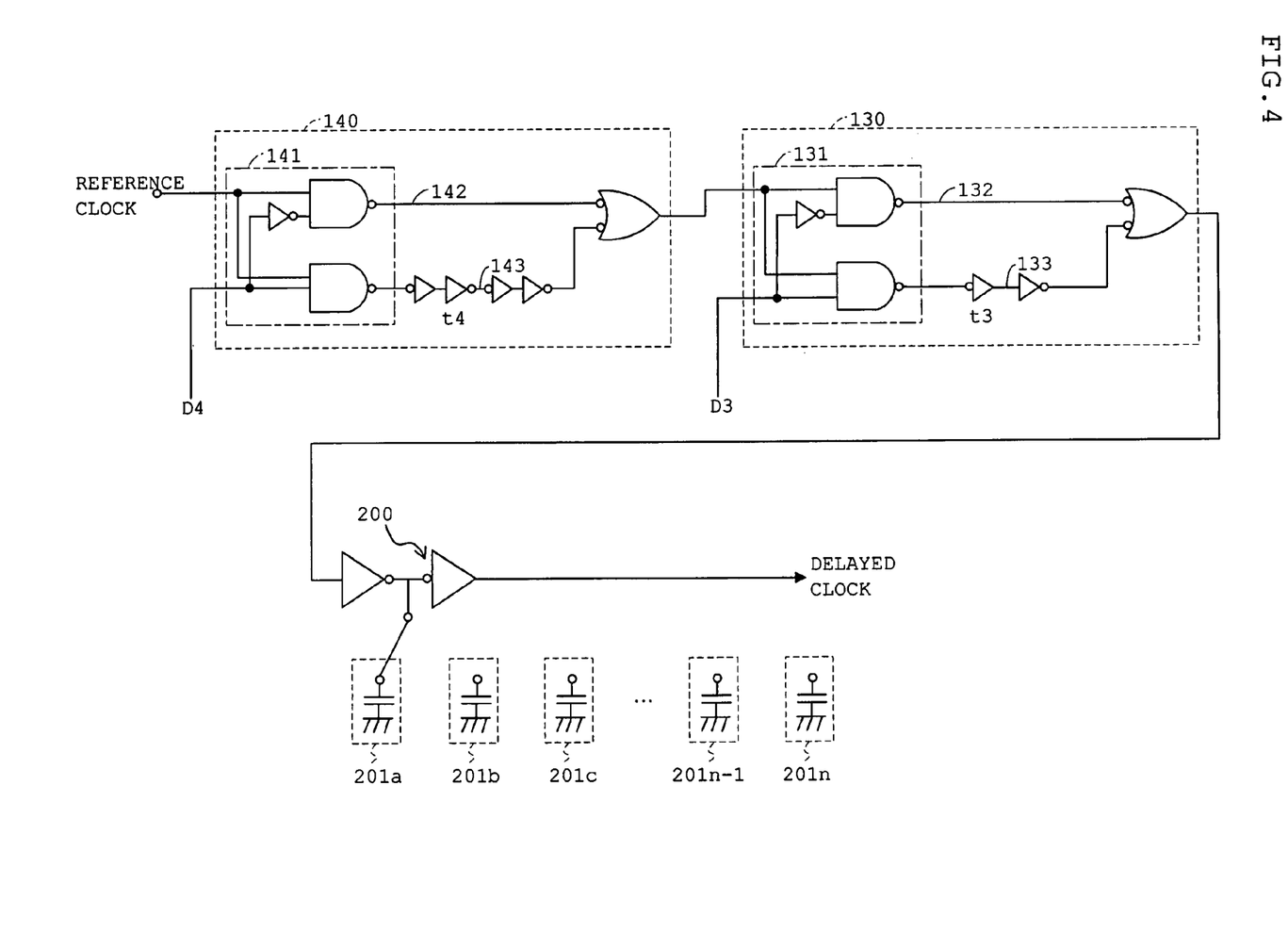
FIG. 4 is a block diagram illustrating a structure of another embodiment of the variable delay circuit according to the present invention.

For example, in place of the structure shown in FIG. 2, such a delay device as shown in FIG. 4 can be used. In the example shown in this drawing, a pair of inverters 200 are provided, and delay devices 201a to 201n consisting of 1 to n passive devices (capacitors) selectively connected to the inverters 200 through a switch are provided. In this case, like the first embodiment mentioned above, an error in delay time can be absorbed by a combination of a plurality of delay devices.

Here, the above-described inverter or switch can be eliminated from the delay device candidates according to the present invention, and the delay device candidates can be constituted of at least passive devices only. Additionally, as the passive device which can be the delay device candidate, a known passive device such as a capacitor shown in FIGS. 2 and 4 as well as a resistor can be used.

As described above, according to the timing generation circuit of the present invention, delay device candidates more than the bit number of the partial bit signal can be assigned in advance, and the delay devices which are actually used can be selected from the delay device candidates. As a result, even if a delay time of the delay device in the delay device candidates greatly deviates from a designed value, other delay device candidates corresponding to the bit number can be combined and selected.

Consequently, an error can be absorbed by combining the delay devices corresponding to the partial bit signal, and irregularities in intervals of the delay times can be suppressed to the minimum level. Therefore, an error in delay time of the variable delay circuit can be absorbed without increasing the bit number of the path data, the timing accuracy according to a design can be realized, and the timing accuracy according to the design can be realized without recreating the variable delay circuit.

Therefore, the present invention is useful as the timing generator packaged in a semiconductor test apparatus requiring highly accurate timing generation according to a design.

The invention claimed is:

1. A timing generator comprising:
   a variable delay circuit having a first group of delay devices and a second group of delay devices for generating delay times different from each other are connected in series; and
   a linearization memory which stores delay paths and delay times obtained based on a combination of the delay devices in the order of the delay times and outputs path data which specifies a delay path where the path data is configured by a first group of bits for selecting delay devices in the first group of delay devices and a second group of bits for selecting delay devices in the second group of delay devices,
   the timing generator outputting a delayed clock signal obtained by delaying a reference clock signal as much as a predetermined time,
   wherein delay device candidates more than the bit number of the second group of bits are provided in the second group of delay devices, and
   wherein the timing generator includes a selection unit which selects the delay devices whose number is equal to the bit number of the second group of bits from the delay device candidates in the second group of delay devices.

2. The timing generator according to claim 1, wherein the delay device candidates in the second group of delay devices are constituted of a plurality of delay devices in the order of the short delay times from a delay device having the shortest delay time among the delay devices constituting the variable delay circuit.

3. The timing generator according to claim 1, wherein the delay device candidates in the second group of delay devices consist of passive devices only.

4. The timing generator according to claim 1, wherein the delay device candidates in the second group of delay devices are constituted of the delay devices whose number is larger than the bit number of the partial bit signal by at least one,
   the delay device candidates whose delay times are adjacent to each other are assigned to respective bit terminals of the second group of bits in the selection unit,
   the delay device candidates whose delay times are adjacent to each other are redundantly assigned to the adjacent bit terminals, and
   one delay device in the second group of delay devices is selected with respect to each of the bit terminals from the assigned delay device candidates in such a manner that the delay devices do no overlap among the bit terminals.

5. The timing generator according to claim 1, wherein the selection unit selects the delay devices in the second group of delay devices based on a signal inputted from an external terminal.

6. The timing generator according to claim 1, wherein the selection unit selects the delay devices in the second group of delay devices based on a laser repair.

7. A semiconductor test apparatus comprising:
   a timing generator which outputs a delayed clock signal obtained by delaying a reference clock signal as much as a predetermined time;
   a pattern generator which outputs a test pattern signal in synchronization with the reference clock signal;
   a waveform formatter which formats the test pattern signal in accordance with a device under test and inputs a result to a semiconductor device as a test target; and
   a logic comparator which compares a response output signal from the semiconductor device with the expected data signal,
   wherein the timing generator comprises:
      a variable delay circuit having a first group of delay devices and a second group of delay devices for generating delay times different from each other are connected in series; and
      a linearization memory which stores delay paths and delay times obtained based on a combination of the delay devices in the order of the delay times and outputs path data which specifies a delay path where the path data is configured by a first group of bits for selecting delay devices in the first group of delay devices and a second group of bits for selecting delay devices in the second group of delay devices,
   wherein delay device candidates more than the bit number of the second group of bits are provided in the second group of delay devices, and
   wherein the timing generator includes a selection unit which selects the same number of delay devices as the bit number of the second group of bits from the second group of delay devices.

* * * * *